United States Patent
Mody et al.

(10) Patent No.: US 11,217,424 B2
(45) Date of Patent: Jan. 4, 2022

(54) SYSTEM AND METHOD FOR PERFORMING THREE-DIMENSIONAL COMPOSITIONAL ANALYSES

(71) Applicant: GLOBALFOUNDRIES U.S. Inc., Malta, NY (US)

(72) Inventors: Jay Mody, Ballston Lake, NY (US); Hemant Dixit, Halfmoon, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/874,712

(22) Filed: May 15, 2020

(65) Prior Publication Data
US 2021/0356429 A1 Nov. 18, 2021

(51) Int. Cl.
*H01J 37/285* (2006.01)
*G01N 27/62* (2021.01)

(52) U.S. Cl.
CPC ............ *H01J 37/285* (2013.01); *G01N 27/62* (2013.01)

(58) Field of Classification Search
CPC .................................................... H01J 37/285
See application file for complete search history.

(56) References Cited

U.S. PATENT DOCUMENTS

| | | |
|---|---|---|
| 9,279,849 B2 | 3/2016 | Kane et al. |
| 9,685,513 B2 | 6/2017 | Kub et al. |
| 9,899,197 B2 | 2/2018 | Sanford et al. |
| 2007/0205358 A1* | 9/2007 | Bunton ................. H01J 49/067 250/282 |
| 2012/0080596 A1 | 4/2012 | Vandervorst |
| 2015/0160286 A1 | 6/2015 | Kane et al. |
| 2019/0257855 A1 | 8/2019 | van der Heide |
| 2019/0318907 A1 | 10/2019 | Gorman |
| 2020/0043813 A1 | 2/2020 | Hung et al. |

OTHER PUBLICATIONS

Kelly et al., "Laser Pulsing of Field Evaporation in Atom Tomography," Current Opinion in Solid State and Materials Science, vol. 18, No. 2, 2014, pp. 81-89.

(Continued)

*Primary Examiner* — Eliza W Osenbaugh-Stewart
(74) *Attorney, Agent, or Firm* — Gibb & Riley, LLC; Anthony J. Canale

(57) ABSTRACT

In APT systems and methods, a sample is analyzed by concurrently applying different types of energy to the tip of the sample, thereby causing atom evaporation from the end of the tip. Evaporated atoms are analyzed to determine chemical nature and original position information, which is used to generate a compositional profile. To ensure an accurate profile, the applied energy includes: a D.C. voltage, which lowers the critical energy level (Q) for atom evaporation; first laser pulses, which are applied to opposing first sides of the tip near the end to further lower Q and which are phase-shifted so resulting standing wave patterns of heat distribution have energy maxima that are offset and below a threshold to avoid damage to tip side surfaces; and second laser pulse(s), which is/are applied to second side(s) of the tip near the distal end to reach Q and cause atom evaporation from the end.

20 Claims, 10 Drawing Sheets

(56) References Cited

OTHER PUBLICATIONS

Bogdanowicz et al., "Impact of the Apex of an Elongated Dielectric Tip Upon its Light Absorption Properties," Applied Surface Science, vol. 302, No. 30, 2014, pp. 223-225.
Bogdanowicz et al., "Light Absorption in Conical Silicon Particles," Optics express, vol. 21, No. 3, 2013, pp. 3891-3896.
Atom Probe Tomography—Introduction to the technique, https://www.cameca.com/products/apt/techique, Accessed on May 8, 2020, pp. 1-4.
Carrasco et al., "Modeling Field Evaporation Degradation of Metallic Surfaces by First Principles Calculations: A Case Study for Al, Au, Ag, and Pd," Chilean Physics Symposium, IOP Publishing, IOP Conf. Series: Journal of Physics: Conf. Series 1043, 012039, 2018, pp. 1-9.

\* cited by examiner

SYSTEM AND METHOD FOR PERFORMING THREE-DIMENSIONAL COMPOSITIONAL ANALYSES

BACKGROUND

Field of the Invention

The present invention relates to three-dimensional (3D) compositional analyses of samples and, more particularly, to embodiments of a system and a method for performing a three-dimensional (3D) compositional analysis of a sample.

Description of Related Art

Atom Probe Tomography (APT) is an atomic-scale three-dimensional (3D) compositional analysis technique performed, for example, on a sample of an integrated circuit (IC) (also referred to herein as a specimen). The sample can have a cone or needle-shaped tip with one end having a very small radius. Energy can be applied to the sample in order to cause evaporation of atoms from the surface at the distal end of the tip. The evaporated atoms can be captured and analyzed in order to determine both the chemical nature of each evaporated atom and the original position of each evaporated atom within the tip. The chemical nature and original position information for all of the evaporated atoms can be used to construct an atomic scale 3D compositional profile of the tip. However, if the energy applied to the sample causes damage (e.g., cracks) in the sides of the sample, the chemical nature and original position information may be inaccurate and, thus, the 3D compositional profile that is constructed based on that information may also be inaccurate.

SUMMARY

In view of the foregoing, disclosed herein are embodiments of an atom probe tomography (APT) system and method. In the disclosed embodiments, a compositional analysis of the tip of a sample can be performed by concurrently applying different types of energy to the sample in order to cause field evaporation of atoms from the sample surface at the distal end of the tip and by capturing and analyzing the evaporated atoms. To ensure an accurate compositional analysis based on the evaporated atoms, the different types of energy can include: a high D.C. voltage, which can be applied to the sample to lower the critical energy level (Q) for atom evaporation; first laser pulses, which can be applied to opposing first sides, respectively, of the tip near the distal end to further lower the critical energy level (Q) and which can also be asynchronous (i.e., phase-shifted) so that resulting standing wave patterns of heat distribution across the sample are offset and have energy maxima below a given threshold to avoid damage to the side surfaces of the tip; and second laser pulse(s), which is/are lastly applied to second side(s) of the tip near the distal end to reach the critical energy level (Q), thereby causing field evaporation of atoms from the sample surface at the distal end of the tip.

More particularly, disclosed herein are embodiments of an atom probe tomography (APT) system. The APT system can include a voltage supply device, which is electrically connectable to a sample (e.g., of an integrated circuit) to be analyzed. This sample can have a tip with a sharp distal end. The APT system can further include multiple laser devices. These laser devices can include: two first laser devices, which are aimable toward opposing first sides of the tip; and one or more second laser devices, which is/are aimable toward second side(s) of the tip. The APT system can further include a position-sensitive detection (PSD) device, which is positioned adjacent to the distal end of the tip. The APT system can further include a controller, which is in communication with the above-mentioned devices and which controls (i.e., is adapted to control, configured to control, executes a set of program instructions to control, etc.) the above-mentioned devices in order to cause performance of a compositional analysis of the tip.

Specifically, during the performance of the compositional analysis of the tip, the controller can cause different types of energy to be concurrently applied to the sample in order to cause field evaporation of atoms from the sample surface at the distal end of the tip. The different types of energy can include a relatively high D.C. voltage, which is applied by the voltage supply device to the sample in order to lower the critical energy level (Q) required for evaporation of atoms from the distal end of the tip of the sample. The different types of energy can further include first laser pulses, which are applied by the first laser devices to the opposing first sides, respectively, of the tip adjacent to the distal end to further lower the critical energy level (Q) and which are also asynchronous (i.e., phase-shifted) so that standing wave patterns of heat distribution across the sample in response to the first laser pulses are offset and have energy maxima that are below a given threshold to avoid damage to the side surfaces of the tip (e.g., due to atom evaporation from side surfaces of the tip). The different types of energy can also further include one or more second laser pulses, which is/are lastly applied by the one or more second laser devices to second side(s) of the tip adjacent the distal end in order to reach the critical energy level (Q) and, thereby ultimately cause field evaporation of atoms from the sample surface at the distal end of the tip. Additionally, during the performance of the compositional analysis of the tip, the PSD device can receive atoms, which have been evaporated from the distal end of the tip and projected toward the PSD device. The PSD device can also determine chemical nature and original position information for each received atom and generate a 3D compositional profile for the tip, based on the chemical nature and original position information associated with all the received atoms.

Also disclosed herein are embodiments of an atom probe tomography (APT) method. The method can include providing an APT system, as described in detail above. That is, the provided APT system can include a voltage supply device, which is electrically connectable to a sample to be analyzed. This sample can have a tip with a sharp distal end. The provided APT system can further include multiple laser devices. These laser devices can include: two first laser devices, which are aimable toward opposing first sides of the tip; and one or more second laser devices, which is/are aimable toward second side(s) of the tip. The provided APT system can further include a position-sensitive detection (PSD) device, which is positioned adjacent to the distal end of the tip. The provided APT system can further include a controller, which is in communication with the above-mentioned devices and which controls (i.e., is adapted to control, configured to control, executes a set of program instructions to control, etc.) the above-mentioned devices in order to cause performance of a compositional analysis of the tip.

The method can further include executing, by the controller, program instructions to cause the APT system to perform a compositional analysis of the tip of a sample (e.g., of an integrated circuit (IC)). Performing the compositional analysis of the tip of the sample can include concurrently applying different types of energy to the sample in order to cause field evaporation of atoms from the sample surface at the distal end of the tip. Concurrently applying different types of energy to the sample can include applying, by the voltage supply device, a relatively high D.C. voltage to the sample in order to lower the critical energy level (Q) required for evaporation of atoms from the distal end of the tip of the sample. Concurrently applying different types of energy to the sample can further include applying, by the first laser devices to opposing first sides of the tip adjacent to the distal end, first laser pulses. Application of the first laser pulses can be performed to further lower the critical energy level (Q). Furthermore, the first laser pulses can be asynchronous (i.e., phase-shifted) so that standing wave patterns of heat distribution across the sample in response to the first laser pulses are offset and have energy maxima that are below a given threshold to avoid damage to the side surfaces of the tip (e.g., due to atom evaporation from side surfaces of the tip). Concurrently applying different types of energy to the sample can further include applying, by the second laser device(s), second laser pulse(s) to second side(s) of the tip adjacent the distal end. Application of the second laser pulse(s) can be performed in order to reach the critical energy level (Q) and, thereby ultimately cause the field evaporation of atoms from the sample surface at the distal end of the tip. Performing the compositional analysis of the tip of the sample can further include: receiving, by the PSD device, atoms, which have been evaporated from the distal end of the tip and projected toward the PSD device; determining, by the PSD device, chemical nature and original position information for each received atom; and generating, by the PSD device, a 3D compositional profile for the tip, based on the chemical nature and original position information associated with all the received atoms.

Also disclosed herein are embodiments of a computer program product. This computer program product can be computer readable storage medium that has program instructions embodied therewith (e.g., stored thereon). The program instructions can be executable by the controller (e.g., a computer or processor) of the above-described atom probe tomography (APT) system to cause the APT system to perform a method and, particularly, the above-described APT method.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
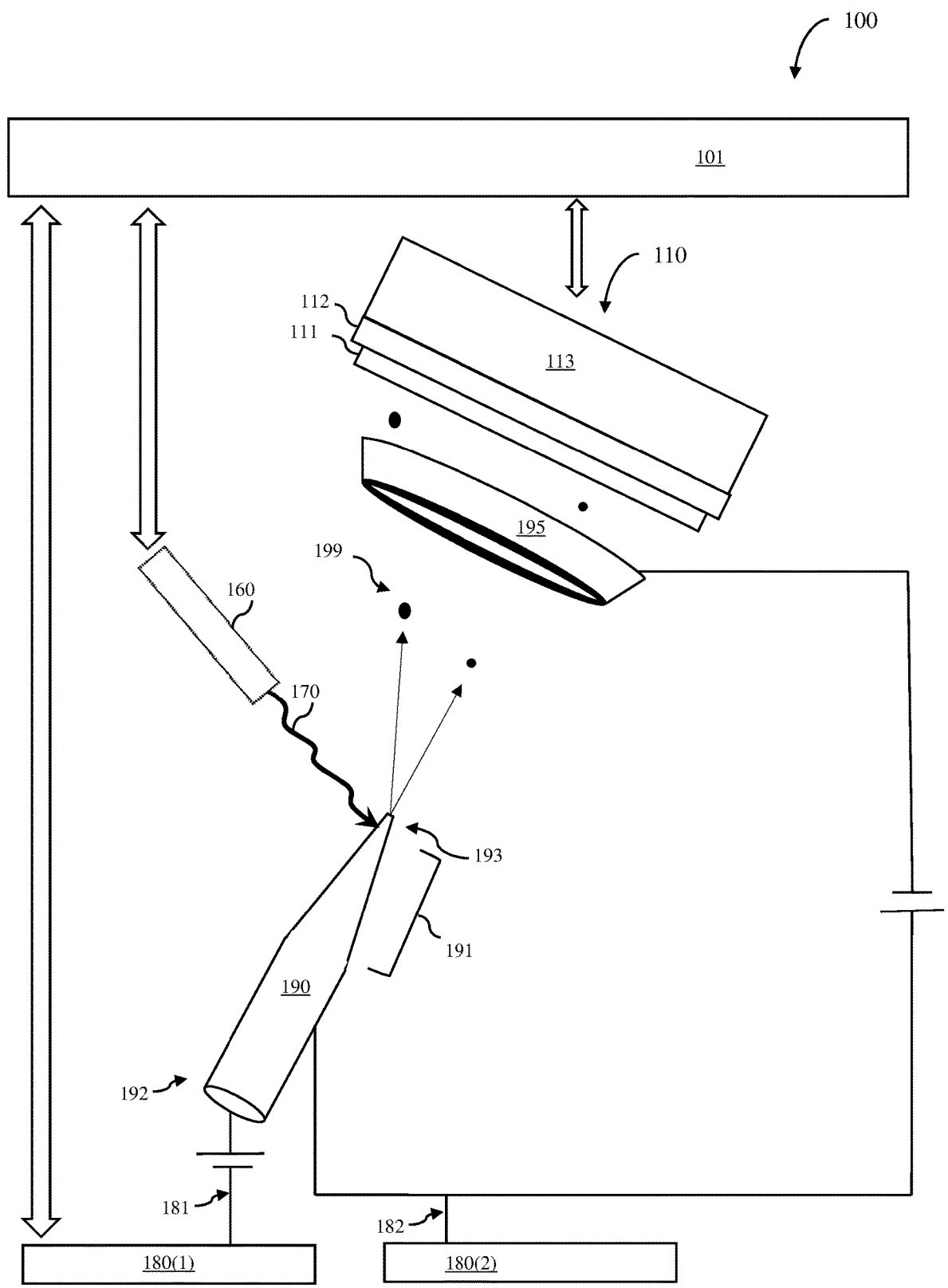
FIG. 1 is a schematic drawing illustrating a prior art Atom Probe Tomography (APT) system.

As mentioned above, Atom Probe Tomography (APT) is an atomic-scale three-dimensional (3D) compositional analysis technique. FIG. 1 is a schematic diagram illustrating an exemplary APT system 100. This APT system 100 includes a first voltage supply device 180(1), an optional second voltage supply device 180(2), a laser device 160, a Position-Sensitive Detection (PSD) device 110 and a controller 101, which is in communication with and controls operation of the various devices 180(1)-(2), 160 and 110.

To perform a compositional analysis using this APT system 100, the following process steps can be performed. A sample 190 for analysis can be acquired. The sample 190 can have a base 192 and a tip 191 having a sharp cone or needle-shape (i.e., a tip where the distal end 193 has a very small radius). A sufficient amount of energy can be applied to the sample 190 to cause atoms 199 from the sample surface at the distal end 193 of the tip 191 to field evaporate and, particularly, to ionize and be projected toward the PSD device 110. This energy can be supplied to the sample 190 using a combination of a high D.C. voltage 181 (also referred to herein as a bias voltage) applied near the base 192 by the first voltage supply device 180(1), an optional voltage pulse 182 applied between the sample 190 and a local electrode 195 (which is positioned adjacent to the distal end 193 of the tip 191) by the optional second voltage supply device 180(2), and a single laser pulse 170 applied to the sample 190 near the distal end 193 of the tip 191 by the laser device 160. Specifically, given the small radius of the distal end 193 of the tip 191 of the sample 190 and further given the high D.C. voltage 181 and the optional voltage pulse 182, a high electrostatic field can be generated near the distal end 193 of the tip 191, thereby lowering the critical energy (Q) required for field evaporation (i.e., ionization) of atoms from the sample surface at the distal end 193. The critical energy (Q) is then delivered by the single laser pulse 170 so that one or more atoms 199 (i.e., ions) are projected from the sample surface at the distal end 193 of the tip 191 toward the PSD device 110 (also referred to herein as a PSD assembly) and, particularly, through a micro-channel plate 111 and onto a cross-delay line two-dimensional (2D) position-sensitive detector 112 of the PSD device 110. A PSD analyzer 113 of the device 110, which is in communication with the 2D position-sensitive detector 112, can determine both the chemical nature and the original position of each received atom 199. For example, the chemical nature of each received atom 199 can be determined using time-of-flight mass spectrometry and the original position of each received atom 199 from within the tip can be determined based on 2D position information captured by the 2D position-sensitive detector 112 and other APT system specifications. In any case, the chemical nature and original position information for all of the received atoms as determined by the PSD analyzer 113 can be employed by the PSD analyzer 113 to construct a three-dimensional (3D) compositional profile of the tip 191.

Figure 2A:
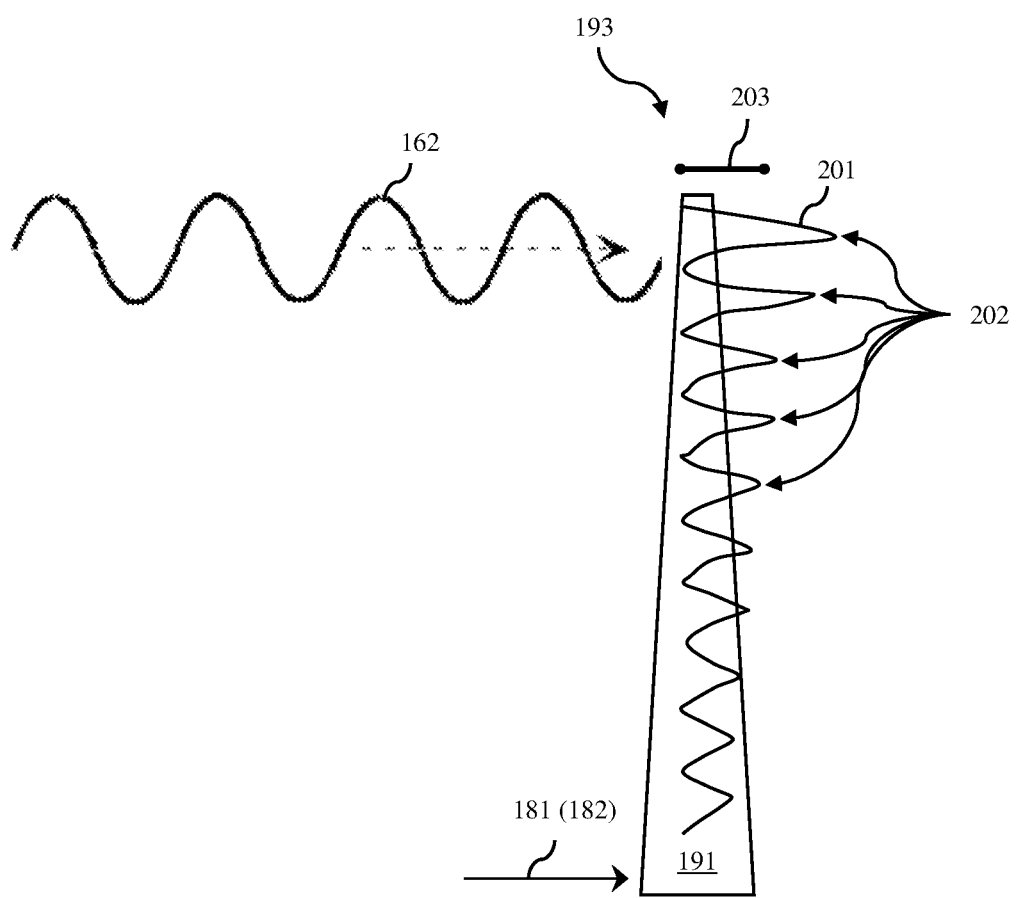
FIGS. 2A-2B are drawings illustrating a sample during a compositional analysis performed by the prior art APT system.
Figure 2B:
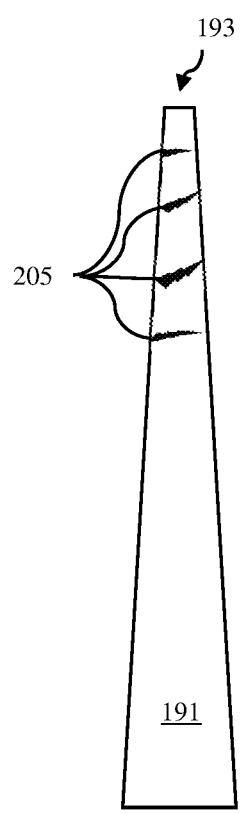

However, if the tip 191 of the sample 190 is damaged as a result of the laser pulse 170, the chemical nature and original position information of the evaporating atoms (as determined by the PSD analyzer 113) may be inaccurate and, thus, any 3D compositional profile that is constructed based on that information may also be inaccurate. More specifically, some materials (e.g., some metals) may have relatively low critical energies for field evaporation of atoms. Therefore, the power of the laser pulse can be set at a relatively low level sufficient to reach the low critical energy level for atom evaporation and the sample will not heat up to the point of causing damage to the sides of the sample. However, other materials (e.g., some insulator and/or semiconductor materials) may have relatively high critical energies for field evaporation of atoms. Therefore, the power of the laser pulse must be set at a relatively high level sufficient to reach the high critical energy level (Q) for atom evaporation. As a result of the laser pulse, heat may be distributed in a standing wave pattern 201 from the distal end 193 of the tip 191 towards the base 192 (e.g., as shown in FIG. 2A). The energy maxima 202 (i.e., the peaks) of this standing wave pattern 201 will decrease from the distal end 193 toward the base 192 of the sample. However, if the energy maxima 202 are above a certain threshold 203, heat distribution caused by the laser pulse can result in field evaporation of atoms from not only the distal end 193 of the tip (as desired) but also from the side surfaces of the tip 191. Evaporation of atoms from the side surfaces of the tip results in damage (e.g., cracks 205), as shown in FIG. 2B. Due to these cracks 205, the 3D compositional profile may fail to show a material layer that is present in the tip, may show a material layer that is thinner than the actual material layer in the tip, and/or may show a material layer that is thicker than the actual material layer in the tip.

In view of the foregoing, disclosed herein are embodiments of an improved atom probe tomography (APT) system and method. In the disclosed embodiments, a compositional analysis of the tip of a sample (e.g., of an integrated circuit (IC)) can be performed by concurrently applying different types of energy to the sample in order to cause field evaporation of atoms from the distal end of the tip and by capturing and analyzing the evaporated atoms. To ensure an accurate compositional analysis based on the evaporated atoms, the different types of energy can include: a relatively high D.C. voltage, which can be applied to the sample to lower the critical energy level (Q) for atom evaporation; first laser pulses, which can be applied at the same time to opposing first sides, respectively, of the tip near the distal end to further lower the critical energy level (Q) and which can also be asynchronous (i.e., phase-shifted) so that resulting standing wave patterns of heat distribution across the sample are offset and have energy maxima below a given threshold to avoid damage to (e.g., cracks in) the side surfaces of the tip; and second laser pulse(s), which is/are lastly applied to second side(s) of the tip near the distal end to reach the critical energy level (Q), thereby causing atom evaporation from the distal end of the tip.

Figure 3:
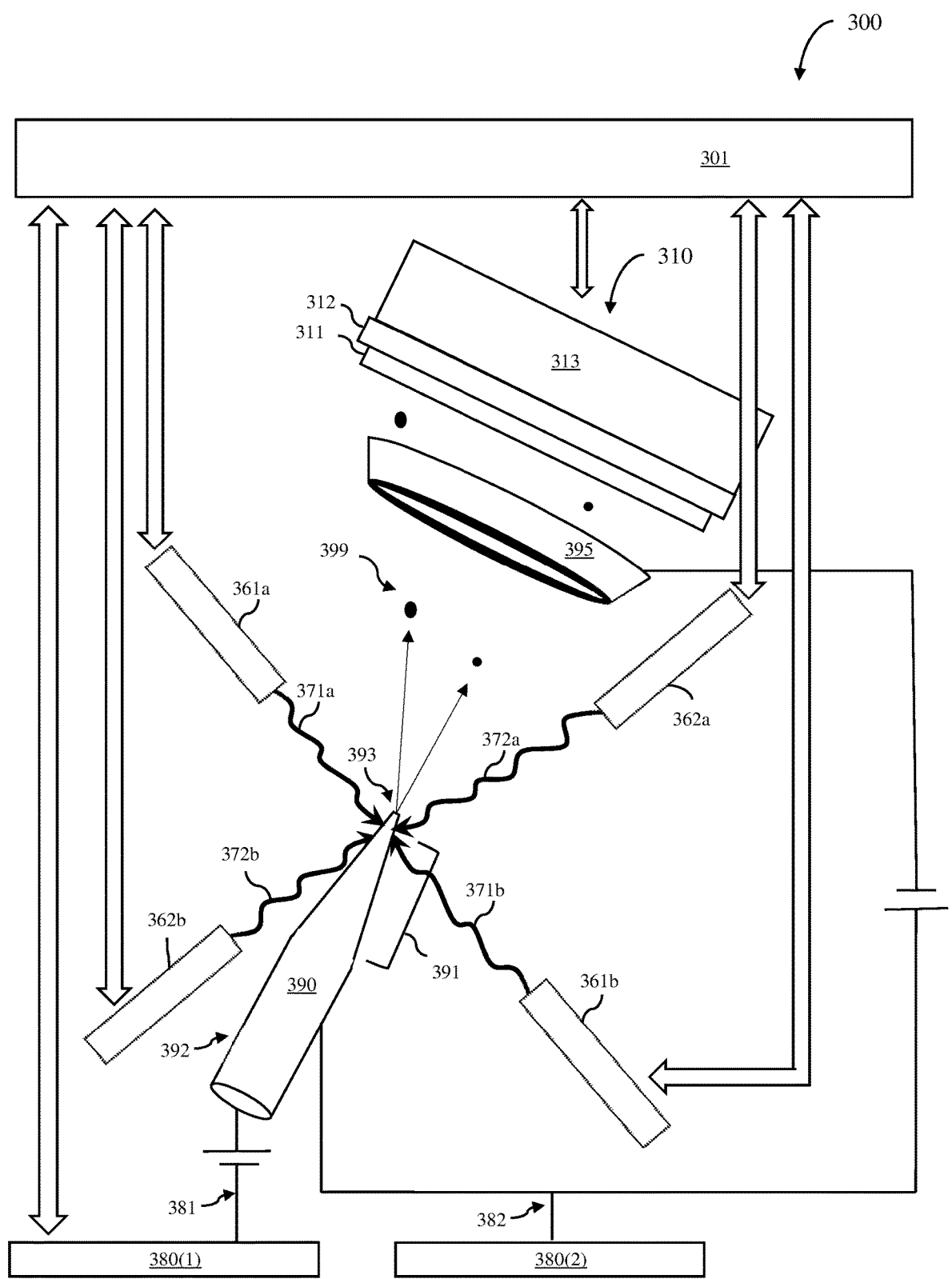
FIG. 3 is a schematic drawing illustrating disclosed embodiments of APT system.

More particularly, referring to FIG. 3, disclosed herein are embodiments of an atom probe tomography (APT) system 300, which is configured to perform an atomic scale compositional analysis of a tip 391 of a sample 390.

The sample 390 (also referred to herein as a specimen) can be, for example, a relatively small cored or cut section of an integrated circuit (IC) device. This sample can include one or more material layers such as any of metal, insulator and/or semiconductor layers. In any case, the sample 390 can be prepared for analysis such that it has a base 392 and a tip 391 with a proximal end adjacent to the base 392 and a distal end 393 opposite the proximal end. The tip 391 can be, for example, cone-shaped or needle-shaped such that the distal end 393 is very sharp or pointed. That is, the distal end 393 of the tip 391 can have a very small radius (e.g., a radius of 20-100 nm). Techniques for preparing samples for APT are known in the art and, thus, the details have been omitted from this specification in order to allow the reader to focus on the salient aspects of the disclosed APT system. It should be noted that prior to the performance of the compositional analysis, the sample should be cooled to a cryogenic temperature of, for example, 20°-100° K.

The APT system 300 can include a first voltage supply device 380(1), which is electrically connectable to the sample 390 to be analyzed (e.g., at the base 392). This first voltage supply device 380(1) can be configured to apply (e.g., can be structured to apply) a selected relatively high D.C. voltage 381 (also referred to herein as a bias voltage) to the sample 390 through the electrical connection. That is, the first voltage supply device 380(1) can be configured to apply a direct current (D.C.) at a selected relatively high voltage. This D.C. voltage 381 can be, for example, 2-15 kV.

The APT system 300 can further include an optional local electrode 395. This optional local electrode 395 can be positioned adjacent to and, particularly, facing the distal end 393 of the tip 391. In this case, the APT system 300 can include an optional second voltage supply device 380(2), which is electrically connected to both the sample 390 and the optional local electrode 395 and which is configured to apply (e.g., which is structured to apply) a voltage pulse 382 between the sample 390 and the local electrode 395. Alternatively, the first voltage supply device 380(1) could be electrically connected to the optional local electrode 395 and could further be configured to apply a voltage pulse 382 between the sample 390 and the local electrode 395 (not shown). Incorporating the local electrode 395 into the APT system to enable application of an optional voltage pulse 382 enables selective application of a field to a single sample in an array of samples.

The APT system 300 can further include multiple laser devices. For purposes of this disclosure, a laser device refers to an apparatus, which is configured to generate (e.g., which is structured to generate) a laser pulse according to selected specifications (e.g., for wavelength, amplitude, phase, etc.) and which is aimable in order to direct that laser pulse in a beam toward a given position. These laser devices can be femtosecond lasers. A femtosecond laser refers to a laser that is configured to emit optical pulses with a duration in the domain of femtoseconds. Generally, such laser devices are well known in the art. Thus, a detailed description of the laser devices included in the APT system 300 have been omitted from the specification in order to allow the reader to focus on the salient aspects of the disclosed embodiments and, particularly, on operation of the various laser devices during a compositional analysis of the tip.

In any case, the laser devices of the APT system 300 can include two first laser devices 361a-361b. These two first laser devices 361a-361b can be structured so as to be aimable specifically toward opposing first sides of the tip 391. These first laser devices 361a-361b can further be structured so as to generate and output first laser pulses 371a-371b, respectively, during the performance of a compositional analysis of a sample as discussed further below.

The laser devices can also include one or more second laser devices, which is/are structured so as to be aimable toward second side(s) of the tip 391. For purposes of illustration, two second laser devices 362a-362b are shown in FIG. 3 and these two second laser devices 362a-362b are aimable toward opposing second sides of the tip. However, it should be understood that the figures are not intended to be limiting. Alternatively, the laser devices of the APT system could include only a single second laser device aimable toward one side of the tip, two second laser devices that are aimable toward non-opposing sides of the tip, or more than two second laser devices that are aimable to more than two sides, respectively, of the tip. The second laser device(s) 362a-362b can further be structured so as to generate and output second laser pulse(s) 372a-372b, respectively, during the performance of a compositional analysis of a sample as discussed further below.

The APT system 300 can further include a position-sensitive detection (PSD) device 310 (also referred to herein as a PSD assembly). This PSD device 310 can include, for example, a cross-delay line two-dimensional (2D) position-sensitive detector 312 and a micro-channel plate 311, which is positioned adjacent to and between the distal end 393 of the tip 391 and the 2D position-sensitive detector 312. The PSD device 310 can further include a PSD analyzer 313 in communication with the 2D position-sensitive detector 312. PSD devices are well known in the art and, thus, the details thereof have been omitted from this specification in order to allow the reader to focus on the salient aspects of the disclosed embodiments. It should, however, be noted that in embodiments that include the optional local electrode 395, as discussed above, the local electrode 395 can be positioned between the distal end 393 of the tip 391 and the micro-channel plate 311 of the PSD device 310. Furthermore, the local electrode 395 can have an opening or channel that extends therethrough and that has a diameter that is sufficiently large to allow atoms 399 evaporated off the distal end 393 of the tip 391 (as discussed in greater detail below) to pass unobstructed toward the micro-channel plate 312.

The APT system 300 can further include a controller 301 (e.g., a computer, a processor, etc.), which is in communication with the above-mentioned devices including the first voltage supply device 380(1), the optional second voltage supply device 380(2), the multiple laser devices (including the first laser devices 361a-361b and the second laser device(s) 362a-362b) and the PSD device 310. This controller 301 can control (i.e., can be adapted to control, can be configured to control, can execute a set of program instructions to control, etc.) the above-mentioned devices in order to cause performance of the atomic scale compositional analysis of the tip 391 of the sample 390 by the APT system 300.

Specifically, during the performance of the compositional analysis of the tip 391, the controller 301 can cause multiple different types of energy to be concurrently applied to the sample 390 in order to generate a sufficiently high electric field to cause evaporation (i.e., ionization) of individual atoms 399 from the distal end 393 of the tip 391 such that they are projected (e.g., as ions) toward the PSD device 310 (as shown in FIGS. 4A-4D).

The different types of energy that can be concurrently applied to the sample to generate a sufficiently high electric field to cause evaporation (i.e., ionization) of individual atoms 399 from the distal end 393 of the tip 391 such that they are projected (e.g., as ions) toward the PSD device 310 are discussed in detail below. However, it should be noted that, for purposes of this disclosure, "concurrent" application of different types of energy to the sample does not mean simultaneous initiation of the application of those different types of energy to the sample. Instead, during "concurrent" application of the different types of energy to the sample, initiation of the application of one or more of the different forms of energy may occur at the same time or in sequence; however, regardless of when application of each of the different types of energy is initiated, only when all of the different types of energy are applied together (i.e., at the same time) will the electric field be sufficiently high to cause the evaporation of individual atoms 399 from the distal end 393 of the tip 391 such that they are projected (e.g., as ions) toward the PSD device 310.

Those skilled in the art will recognize that the probability (P) that an atom will field evaporate from a surface will be proportional to the following:

$$v \exp(-Q/k_B T),$$

where v refers to an attempt frequency, Q refers to the evaporation activation energy for that atom (also referred to herein as the critical energy level required for evaporation of the atom), $k_B$ refers to the Boltzmann constant, and T refers to the temperature of the sample.

Figure 4A:
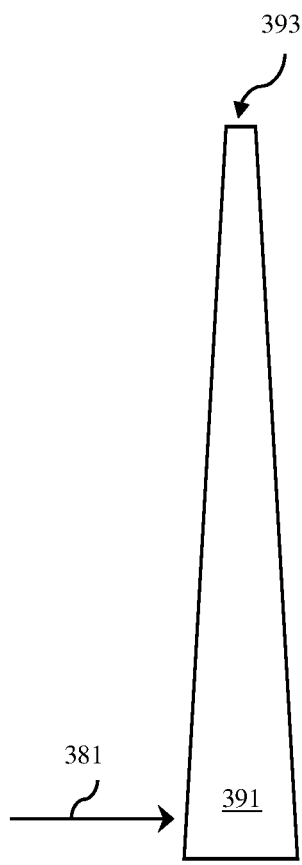
FIGS. 4A-4E are drawings illustrating a sample during a compositional analysis performed by the disclosed APT system.

The different types of energy can include a selected relatively high D.C. voltage (also referred to herein as a bias voltage), which is applied by the voltage supply device 380(1) to the sample 390 in order to generate an electrostatic field at the distal end 393 of the tip 391 of the sample 390 and, thereby lower the critical energy level (Q) that will be required for evaporation of individual atoms from that distal end 393 (see FIG. 4A). It should be noted that the selected high D.C. voltage can be applied first and can be ramped to avoid sudden introduction of a large amount of energy across the sample.

Figure 4B:
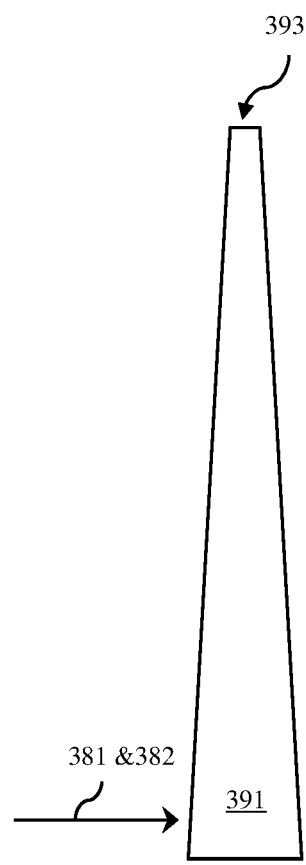

The different types of energy can further include an optional voltage pulse 382, which is applied by the first voltage supply device 380(1) or, if applicable, which is applied by an optional second voltage supply device 380(2) between the sample 390 and an optional local electrode 395 (described above) in order to locally increase the electric field and further lower the critical energy level (Q) (see FIG. 4B). Application of the voltage pulse 382 can occur following initiation of and during application of the high D.C. voltage 381. As mentioned above, this optional voltage pulse 382 allows the field to be applied selectively to a single sample in an array of samples.

Figure 4C:
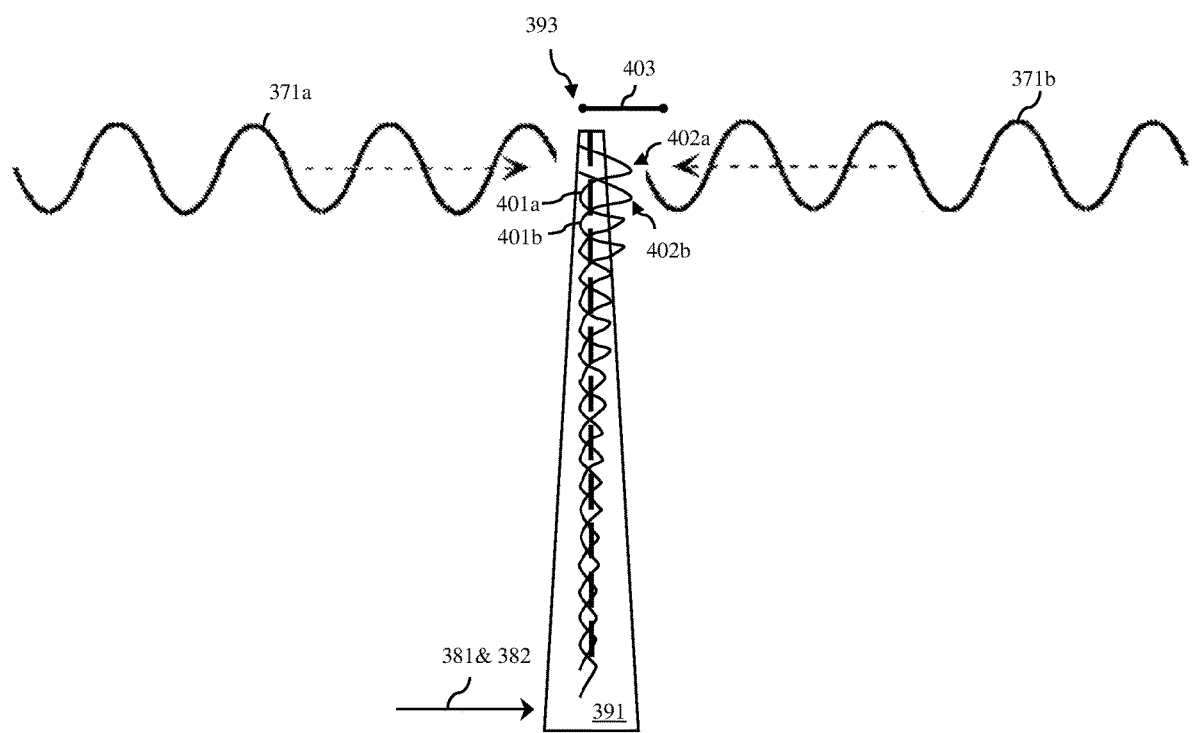

The different types of energy can further include first laser pulses 371a-371b, which are locally applied by the first laser devices 361a-361b to the opposing first sides, respectively, of the tip 391 adjacent to the distal end 393 (see FIG. 4C). As mentioned above, the two first laser devices 361a-361b can be aimable toward opposing first sides of the tip 391. During performance of the compositional analysis of the tip of the sample, the controller 301 can cause the first laser devices 361a-361b to generate and output two first laser pulses 371a-371b and to direct those two first laser pulses 371a-371b as laser beams in vector directions that are essentially perpendicular to the opposing first sides, respectively, of the tip 391 near the distal end 393. For purposes of this disclosure, an essentially perpendicular beam is a beam that is oriented 90° from a side surface of the tip 391 plus or minus 10°. Thus, the vector directions for the first laser pulses 371a-371b are offset by essentially 180° plus or minus 20°.

Initiation of the application of these first laser pulses can be essentially simultaneous and application of these first laser pulses 371a-371b can locally increase the electric field at the distal end of the tip and can further lower the critical energy level (Q) for atom evaporation without actually triggering spontaneous evaporation of surface atoms. Specifically, application of the first laser pulses 371a-371b can occur following initiation of and during application of the high D.C. voltage 381 and the voltage pulse 382 (if applicable). Furthermore, the first laser pulses 371a-371b can be essentially identical but asynchronous (i.e., phase-shifted). That is, the first laser pulses 371a-371b can have the same wavelength, amplitude and power level, but one of the laser pulses can be delayed relative to the other.

The value of the high D.C. voltage 381 (e.g., between 2 kV and 15 kV), the value of the optional voltage pulse 382 and the power level of the first laser pulses 371a-371b (as well as the appropriate amount of phase-shifting) can specifically be selected so that, when the bias voltage 381, the optional voltage pulse 382 and the first laser pulses 371a-371b are concurrently applied to the sample 390, the combined energies applied to the sample are still low enough so as not to cause spontaneous evaporation of surface atoms from the distal end 393 of the tip of the sample. In other words, the power level of each first laser pulse 371a-371b will be less than the power level of the single laser pulse used in the APT system 100 of FIG. 1 and because the first laser pulses 371a-371b are essentially identical but asynchronous (i.e., phase-shifted) and applied on opposite sides of the tip, standing wave patterns 401a and 401b of heat distribution resulting from the application of the first laser pulses 371a-371b, respectively, to the sample will not combine into one single wave pattern with energy maxima above the threshold 403 required for atom evaporation. Instead, these wave patterns 401a and 401b will be offset and will have corresponding energy maxima 402a and 402b (i.e., peaks), which decrease from the distal end toward the base of the sample and which are below the threshold 403, thereby avoiding any heat-related damage to the side surfaces of the tip (i.e., thereby avoiding any cracks in the sides of the tip due to surface evaporation of atoms therefrom).

It should be noted that first laser pulses 371a-371b that are 180°-phase-shifted are optimal for achieving the desired results (i.e., for ensuring that that standing wave patterns 401a and 401b of heat distribution resulting from the application of the first laser pulses 371a-371b, respectively, to the sample 390 will not combine into one single wave pattern with energy maxima above the threshold 403 required for atom evaporation). However, it should be understood that full 180°-phase-shifting may not be necessary. That is, avoiding the single wave pattern of heat distribution with energy maxima above the threshold 403 may be achieved by some lesser amount of phase-shifting (e.g., by 120°-phase-shifting, by 90°-phase shifting, etc.).

Figure 4D:
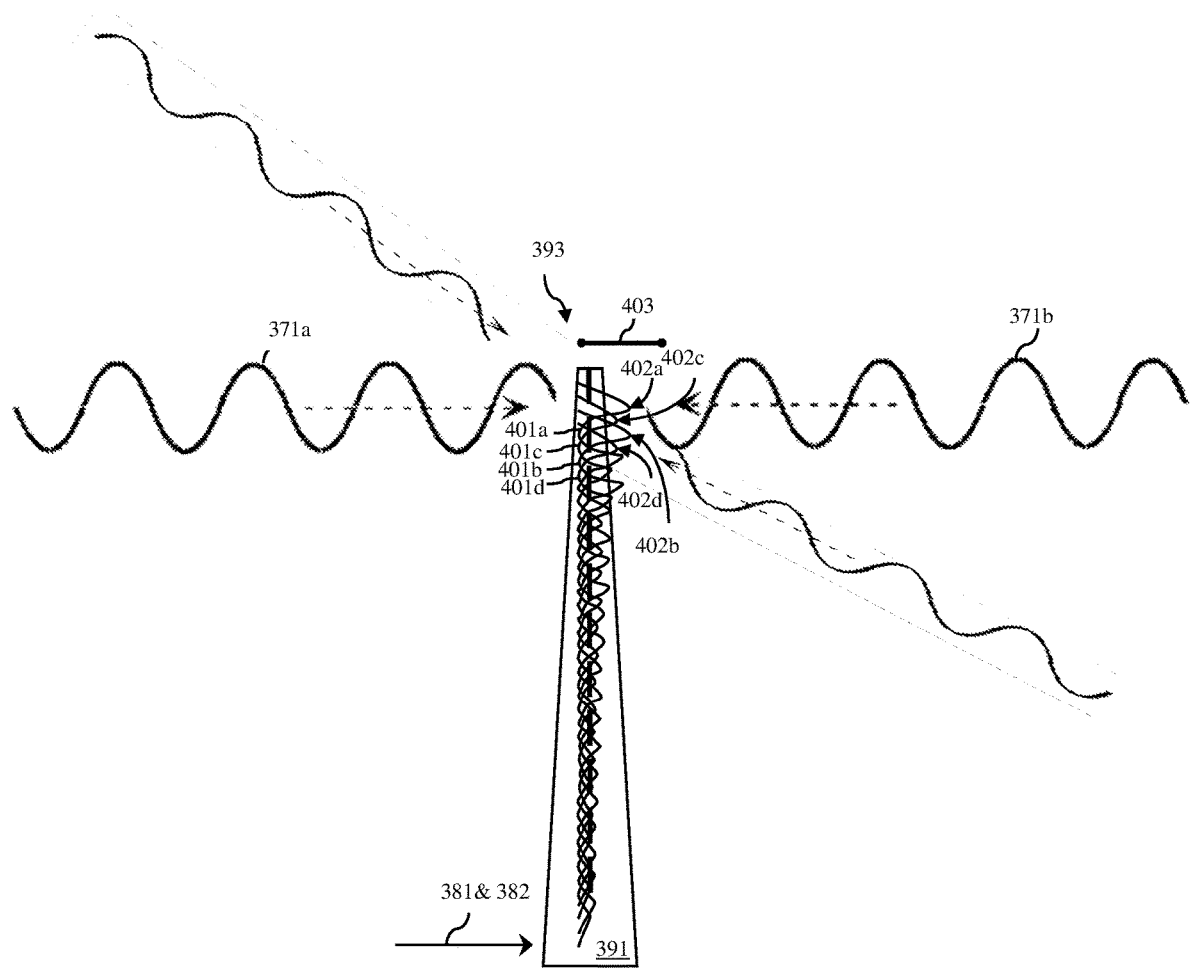

Lastly, the different types of energy can also include one or more second laser pulses 372a-372b, which is/are locally applied by the one or more second laser devices 362a-362b to second side(s) of the tip 391 adjacent the distal end 393 in order to ultimately reach the critical energy level (Q) and, thereby generate a 360° homogeneous field that will cause evaporation of atoms 399 from the distal end 393 of the tip 391 (as shown in FIG. 4D). Initiation of application of the one or more second laser pulse(s) 372a-372b can occur following initiation of and during application of the high D.C. voltage 381 and the voltage pulse 382 (if applicable). Additionally, initiation of application of the one or more second laser pulse(s) 372a-372b can occur following initiation of and during application of the first laser pulses 371a-371b. Alternatively, initiation of application of the one or more of the second laser pulses can occur at the same time as initiation of application of the first laser pulses. In any case, due to the concurrent application of the D.C. voltage 381, optional voltage pulse 382, and the first laser pulse(s) 371a-371b, the critical energy level (Q) required for evaporation of atoms 399 has already been significantly reduced and, thus, the power level of the second laser pulse(s) 372a-372b used to trigger atom evaporation from the distal end 393 of the tip can be relatively low (e.g., as compared to the power level of the first laser pulses 371a-371b).

As mentioned above, for purposes of illustration, two second laser devices 362a-362b are shown in FIG. 3 and these two second laser devices 362a-362b are aimable toward opposing second sides of the tip. However, the figures are not intended to be limiting. Alternatively, the laser devices of the APT system could include only a single second laser device aimable toward one side of the tip, two second laser devices that are aimable toward non-opposing sides of the tip, or more than two second laser devices that are aimable to more than two sides, respectively, of the tip.

With the APT system configuration shown in FIG. 3, two second laser pulses 372a-372b could be applied simultaneously by two second laser devices 362a-362b to the opposing second sides, respectively, of the tip 391 adjacent to the distal end 393 such that vector directions of the first laser pulses 371a-371b are perpendicular to the vector directions of the second laser pulses 372a-372b. In this case, the two second laser pulses 372a-372b could be essentially identical (e.g., could have essentially the same wavelength, amplitude, and power level) but asynchronous (i.e., phase-shifted). For example, by using identical but 180°-phase-shifted second laser pulses 372a-372b, which are applied simultaneously to opposite sides of the tip and in vector directions that are perpendicular to the vector directions of the first laser pulses 371a-371b, additional standing wave patterns 401c and 401d of heat distribution resulting from application of the second laser pulses 372a-372b, respectively, will not combine with each other or with the standing wave patterns 401a and/or 401b of heat distribution caused by the first laser pulses 371a-372b. Instead, these wave patterns 401c and 401d are offset from each other and from the standing wave patterns 401a and 401b and have corresponding energy maxima 402c and 402d (i.e., peaks), which decrease from the distal end toward the base of the sample and which are below the threshold 403 such that, even with the evaporation of atoms from the distal end 393 of the tip caused by the application of the second laser pulses 372a-372b, heat-related damage to the side surfaces of the tip is avoided.

It should be noted that, since, as mentioned above, the power level of the second laser pulse(s) 372a-372b can be relatively low given the already applied D.C. voltage 381, optional voltage pulse 382, and first laser pulses 371a-371b, concern over the second laser pulse(s) 372a-372b causing standing wave pattern(s) of heat distribution with energy maxima over the threshold 403 may be unwarranted. Thus, optionally, alternative protocols could be employed for application of the second laser pulse(s). That is, application of identical but 180°-phase-shifted second laser pulses 372a-372b on opposite sides of the tip at the distal end and in vector directions that are perpendicular to the vector directions of the first laser pulses 371a-371b may not be necessary.

For example, in other embodiments, two second laser pulses 372a-372b could be applied by two second laser devices 362a-362b to the opposing second sides, respectively, of the tip 391 adjacent to the distal end 393 such that vector directions of the first laser pulses 371a-371b are perpendicular to the vector directions of the second laser pulses 372a-372b. However, the second laser pulses 372a-372b could be different (e.g., could have different wavelengths, amplitudes, and/or power levels) and/or the second laser pulses 372a-372b could be applied consecutively (i.e., one after the other) as opposed to simultaneously.

In still other embodiments, two second laser pulses 372a-372b could be applied by two second laser devices 362a-362b to non-opposing sides, respectively, of the tip 391 adjacent to the distal end 393. In this case, the second laser pulses 372a-372b could be essentially the same or different (e.g., could have different wavelengths, amplitudes, and/or power levels), could have the same phase or be phase-shifted, and/or could be applied consecutively (i.e., one after the other) or simultaneously.

In still other embodiments, only a single second laser pulse may need to be applied to the side of the tip 391 near the distal end 393 in order to achieve atom evaporation. In still other embodiments, more than two second laser pulses may be applied to the sides of the tip 391 near the distal end 393 in order to achieve atom evaporation.

Additionally, during the performance of the compositional analysis of the tip 391, the PSD device 310 can receive atoms 399, which have been evaporated from the sample surface at the distal end 393 of the tip 391 and then projected toward the PSD device 310. Specifically, the PSD device 310 can be positioned so that atoms 399, which are evaporated from the distal end 393 of the tip 391, are projected through the micro-channel plate 311 and onto the 2D position-sensitive detector 312. The PSD analyzer 313, which is in communication with the 2D position-sensitive detector 312, can be configured to (e.g., can be adapted to, can execute a program of instructions to, etc.) determine the chemical nature of each received atom 399 as well as the original position of the received atom 399 from inside the sample. For example, the chemical nature of each received atom 399 can be determined using time-of-flight mass spectrometry based on the time of arrival at the 2D position-sensitive detector 312 and the original position inside the sample of each received atom 399 can be determined based on the x,y coordinates of each atom 399 on the 2D position-sensitive detector 312 and other geometrical properties of the APT system 300.

Figure 4E:
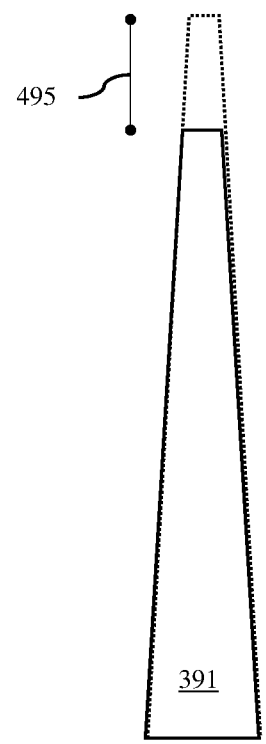
Figure 4F:
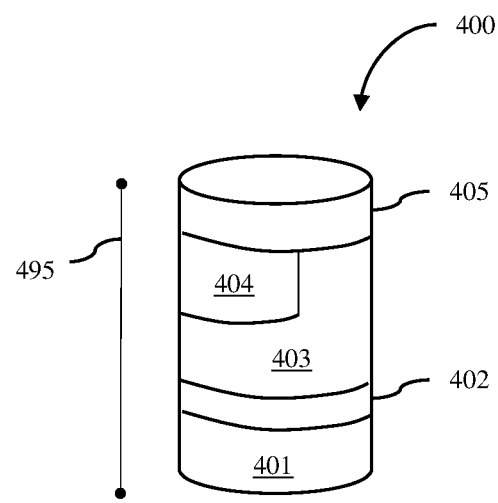
FIG. 4F is a drawing illustrating the results of the compositional analysis.

The controller 301 can further cause application of the different types of energy (described above) to the sample 390 to continue for a predetermined amount of time or, optionally, until a feedback mechanism halts processing based on some threshold being reached (e.g., a threshold number of atoms being captured by the PSD, a threshold number of nanometers of tip length lost, a threshold change in shape of the distal end of the tip due to atom evaporation, etc.). As illustrated in FIG. 4E, at the conclusion of the compositional analysis, some length 495 will be lost off the distal end of the tip 391 of the sample. However, due to the cancelling out of the standing wave patterns of heat distribution caused by the two asynchronous (i.e., phase-shifted) first laser pulses 371a-371b (e.g., by two 180°-phase-shifted first laser pulses 371a-371b), the sides of the tip 391 will remain essentially damage-free (i.e., devoid of cracks). In any case, as the distal end surface atoms are evaporated, captured and analyzed, the chemical nature and original position information for those atoms 399 (as determined by the PSD analyzer 313) can be employed (e.g., by the PSD analyzer 313) to construct an atomic scale three-dimensional (3D) compositional profile 400 of the tip 391 of the sample 390 (e.g., as shown in FIG. 4F). This 3D compositional profile 400 can indicate one or more different material layers (e.g., see layers 401-405 of metal(s), semiconductor(s) and/or insulator(s)) and the locations and shapes of those layer(s) within the sample.

It should be understood that the 3D compositional profile 400 shown in FIG. 4F is for illustration purposes and is not intended to be limiting. The number of layers and/or different types of materials will vary from sample to sample. However, since the disclosed APT system 300 is designed to avoid or minimize cracks in the side surfaces of the sample even when any of the materials within the sample start off with a relatively high critical energy level (Q) required for field evaporation of atoms (e.g., even when the materials within the sample include semiconductor(s) and/or insulator(s)), the accuracy of the 3D compositional profile is improved as compared to prior art APT systems. Specifically, by using the disclosed APT system 300, the material layers that are present in the sample will be accurately identified and shown in the 3D compositional profile with the appropriate shape, thickness, etc.

Figure 5:
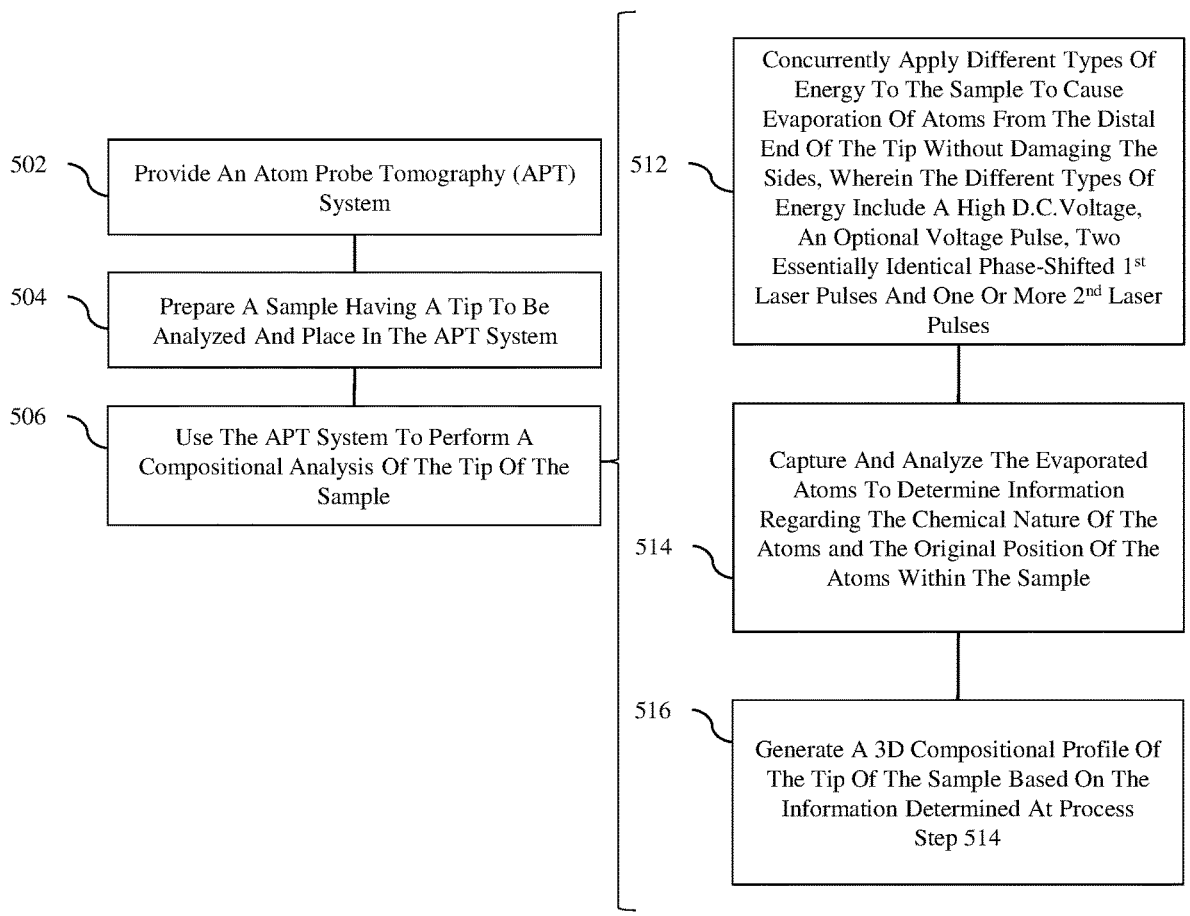
FIG. 5 is a flow diagram illustrating embodiments of an APT method.

Referring to the flow diagram of FIG. 5, also disclosed herein are embodiments of an atom probe tomography (APT) method.

The method can include providing an APT system, such as the APT system 300 illustrated in FIG. 3 and described in detail above (see process step 502).

The method can further include preparing a sample to be analyzed and, particularly, preparing a sample to undergo an atomic scale compositional analysis of the tip 391 of the sample 390 (see process step 504 and FIG. 3). Specifically, as discussed above, the sample 390 (also referred to herein as a specimen) can be a relatively small cored or cut section of an integrated circuit (IC) device. This sample can include one or more material layers such as any of metal, insulator and/or semiconductor layers. In any case, the sample 390 can be prepared for analysis such that it has a base 392 and a tip 391 with a proximal end adjacent to the base 392 and a distal end 393 opposite the proximal end. The tip 391 can be, for example, cone-shaped or needle-shaped such that the distal end 393 is sharp or pointed. That is, the distal end 393 of the tip 391 of the sample 390 can have a very small radius (e.g., a radius of 20-100 nm). Techniques for preparing samples for APT are known in the art and, thus, the details have been omitted from this specification in order to allow the reader to focus on the salient aspects of the disclosed system. It should be noted that prior to the performance of the compositional analysis, the sample should be cooled to a cryogenic temperature of, for example, 20°-100° K.

The method can further include executing, by the controller 301 of the APT system 300, program instructions to cause the APT system 300 and, particularly, the various components thereof (i.e., the first voltage supply device 380(1), the optional second voltage supply device 380(2), the two first laser devices 361a-361b, the one or more second laser devices 362a-362b, and the position-sensitive detection (PSD) device 310) to perform an atomic scale compositional analysis of the tip 391 of the sample 390 (see process step 506).

Performing the compositional analysis of the tip 391 can include concurrently applying different types of energy to the sample 390 in order to cause field evaporation of atoms 399 from the sample surface at the distal end 393 of the tip 391 (see process step 512, see also FIGS. 4A-4D).

Specifically, at process step 512, a selected relatively high D.C. voltage 381 (also referred to herein as a bias voltage) can be applied by the voltage supply device 380(1) to the sample 390 in order to generate an electrostatic field at the distal end 393 of the tip 391 and, thereby lower the critical energy level (Q) that will be required for evaporation of individual atoms from the surface at the distal end 393 (see FIG. 4A). This D.C. voltage 381 can be, for example, 2-15 kV. It should be noted that the selected high D.C. voltage 381 can be applied first and can, optionally, be ramped to avoid sudden introduction of a large amount of energy across the sample.

At process step 512, an optional voltage pulse 382 can be applied by the first voltage supply device 380(1) or, if applicable, by an optional second voltage supply device 380(2) between the sample 390 and an optional local electrode 395 (described above) in order to locally increase the electric field and further lower the critical energy level (Q) (see FIG. 4B). Application of the voltage pulse 382 can occur at process step 512 following initiation of and during application of the high D.C. voltage 381. As mentioned above, this optional voltage pulse 382 allows the field to be applied selectively to a single sample in an array of samples.

At process step 512, two first laser pulses 371a-371b can be locally applied by the first laser devices 361a-361b to the opposing first sides, respectively, of the tip 391 adjacent to the distal end 393 (see FIG. 4C). Specifically, two first laser pulses 371a-371b can be simultaneously directed as laser beams in vector directions that are essentially perpendicular to the opposing first sides, respectively, of the tip 391 near the distal end 393. For purposes of this disclosure, an essentially perpendicular beam is a beam that is oriented 90° from a side surface of the tip 391 plus or minus 10°. Thus, the vector directions for the first laser pulses 371a-371b are offset by essentially 180° plus or minus 20°.

Application of these first laser pulses 371a-371b at process step 512 can locally increase the electric field at the distal end of the tip and can further lower the critical energy level (Q) for atom evaporation without actually triggering spontaneous evaporation of surface atoms. Specifically, application of the first laser pulses 371a-371b can occur following initiation of and during application of the high D.C. voltage 381 and the voltage pulse 382 (if applicable). Furthermore, the first laser pulses 371a-371b can be essentially identical but phase-shifted (e.g., 180°-phase-shifted). That is, the first laser pulses 371a-371b can have the same wavelength, amplitude and power level, but one of the laser pulses can be delayed relative to the other. The value of the high D.C. voltage 381 (e.g., between 2 kV and 15 kV), the value of the optional voltage pulse 382 and the power level of the first laser pulses 371a-371b (along with the amount of phase-shifting) can specifically be selected so that, when the bias voltage 381, the optional voltage pulse 382 and the first laser pulses 371a-371b are concurrently applied to the sample 390, the combined energies applied to the sample are still low enough so as not to cause spontaneous evaporation of surface atoms from the distal end 393 of the tip of the sample. In other words, the power level of each first laser pulse 371a-371b will be less than the power level of the single laser pulse used in the APT system 100 of FIG. 1 and because the first laser pulses 371a-371b are essentially identical but phase-shifted and applied on opposite sides of the tip, standing wave patterns 401a and 401b of heat distribution resulting from the application of the first laser pulses 371a-371b, respectively, to the sample will not combine into one single wave pattern with energy maxima above the threshold 403 required for atom evaporation. Instead, these wave patterns 401a and 401b will be offset and will have corresponding energy maxima 402a and 402b (i.e., peaks), which decrease from the distal end toward the base of the sample and which are below the threshold 403, thereby avoiding any heat-related damage to the side surfaces of the tip (i.e., thereby avoiding any cracks in the sides of the tip due to surface evaporation of atoms therefrom).

It should be noted that first laser pulses 371a-371b that are 180°-phase-shifted are optimal for achieving the desired results (i.e., for ensuring that that standing wave patterns 401a and 401b of heat distribution resulting from the application of the first laser pulses 371a-371b, respectively, to the sample 390 will not combine into one single wave pattern with energy maxima above the threshold 403 required for atom evaporation). However, it should be understood that full 180°-phase-shifting may not be necessary. That is, avoiding the single wave pattern of heat distribution with energy maxima above the threshold 403 may be achieved by some lesser amount of phase-shifting (e.g., by 120°-phase-shifting, by 90°-phase shifting, etc.).

Lastly, at process step 512, one or more second laser pulses 372a-372b can be applied by the one or more second laser devices 362a-362b to second side(s) of the tip 391 adjacent the distal end 393 in order to finally reach the critical energy level (Q) and, thereby create a 360° homogeneous field that will cause evaporation of atoms 399 from the distal end 393 of the tip 391 (as shown in FIG. 4D). Initiation of the application of the one or more second laser pulse(s) 372a-372b can occur at process step 512 following initiation of and during application of the high D.C. voltage 381 and the voltage pulse 382 (if applicable). Additionally, initiation of the application of the one or more second laser pulse(s) can occur at process step 512 following initiation of and during application of the first laser pulses. Alternatively, initiation of application of the one or more of the second laser pulses can occur at the same time as initiation of the application of the first laser pulses.

In some embodiments of the method, two second laser pulses 372a-372b could be simultaneously applied at process step 512 by two second laser devices 362a-362b to opposing second sides, respectively, of the tip 391 adjacent to the distal end 393 such that vector directions of the first laser pulses 371a-371b are perpendicular to the vector directions of the second laser pulses 372a-372b. In this case, the two second laser pulses 372a-372b could be essentially identical (e.g., could have essentially the same wavelength, amplitude, and power level) but asynchronous (i.e., phase-shifted). For example, by using identical but 180°-phase-shifted second laser pulses 372a-372b, which are applied at the same time on opposite sides of the tip and in vector directions that are perpendicular to the vector directions of the first laser pulses 371a-371b, additional standing wave patterns 401c and 401d of heat distribution resulting from application of the second laser pulses 372a-372b, respectively, will not combine with each other or with the standing wave patterns 401a and/or 401b of heat distribution caused by the first laser pulses 371a-372b. Instead, these wave patterns 401c and 401d are offset from each other and from the standing wave patterns 401a and 401b and have corresponding energy maxima 402c and 402d (i.e., peaks), which decrease from the distal end toward the base of the sample and which are below the threshold 403 such that, even with the evaporation of atoms from the distal end 393 of the tip caused by the application of the second laser pulses 372a-372b, heat-related damage to the side surfaces of the tip is avoided.

It should be noted that, since, as mentioned above, the power level of the second laser pulse(s) 372a-372b applied at process step 512 can be relatively low given the already applied D.C. voltage 381, optional voltage pulse 382, and first laser pulses 371a-371b, concern over the second laser pulse(s) 372a-372b causing standing wave pattern(s) of heat distribution with energy maxima over the threshold 403 may be unwarranted. Thus, optionally, alternative protocols could be employed for application of the second laser pulse(s). That is, simultaneous application of identical but 180°-phase-shifted second laser pulses 372a-372b on opposite sides of the tip at the distal end and in vector directions that are perpendicular to the vector directions of the first laser pulses 371a-371b may not be necessary.

For example, in other embodiments of the method, two second laser pulses 372a-372b could be applied at process step 512 by two second laser devices 362a-362b to opposing second sides, respectively, of the tip 391 adjacent to the distal end 393 such that vector directions of the first laser pulses 371a-371b are perpendicular to the vector directions of the second laser pulses 372a-372b. However, the second laser pulses 372a-372b could be different (e.g., could have different wavelengths, amplitudes, and/or power levels) and/or the second laser pulses 372a-372b could be applied consecutively (i.e., one after the other) as opposed to simultaneously.

In still other embodiments of the method, two second laser pulses 372a-372b could be applied at process step 512 by two second laser devices 362a-362b to non-opposing sides, respectively, of the tip 391 adjacent to the distal end 393. In this case, the second laser pulses 372a-372b could be essentially the same or different (e.g., could have different wavelengths, amplitudes, and/or power levels), could have the same phase or be phase shifted, and/or could be applied consecutively (i.e., one after the other) or simultaneously.

In still other embodiments of the method, only a single second laser pulse may need to be applied at process step 512 by a single second laser device to the side of the tip 391 near the distal end 393 in order to achieve atom evaporation. In still other embodiments of the method, more than two second laser pulses may be applied at process step 512 to more than two sides of the tip 391 near the distal end 393 in order to achieve atom evaporation.

Performing the compositional analysis of the tip 391 can further include capturing and analyzing the evaporated atoms 399 from the distal end 393 of the tip 391 of the sample 390 (see process step 514). Specifically, as mentioned above, the PSD device 310 can be positioned so that atoms 399, which are evaporated from the distal end 393 of the tip 391, are projected through the micro-channel plate 311 and onto the 2D position-sensitive detector 312. The method can include determining, by the PSD analyzer 313 that is in communication with the 2D position-sensitive detector 312, the chemical nature for each received atom 399 and the original position of each received atom 399 from inside the sample. For example, the chemical nature of each received atom 399 can be determined using time-of-flight mass spectrometry based on the time of arrival at the 2D position-sensitive detector 312 and the original position inside the sample of each received atom 399 can be determined based on the x,y coordinates of each atom 399 on the 2D position-sensitive detector 312 and other geometrical properties of the APT system 300.

Performing the compositional analysis of the tip 391 can further performing process steps 512-514 for a predetermined amount of time or, optionally, until a feedback mechanism halts processing based on some threshold being reached (e.g., a threshold number of atoms being captured by the PSD, a threshold number of nanometers of tip length lost, a threshold change in shape of the distal end of the tip due to atom evaporation, etc.). As illustrated in FIG. 4E, at the conclusion of the compositional analysis, some length 495 will be lost off the distal end 393 of the tip 391 of the sample 390. However, due to the relatively low energy maxima of the standing wave patterns of heat distribution caused by the two phase-shifted first laser pulses 371a-371b, the sides of the tip 391 will remain essentially damage-free (i.e., devoid of cracks). In any case, as the distal end surface atoms are evaporated, captured and analyzed, the chemical nature and position information for those atoms 399 (as determined by the PSD analyzer 313) can be employed (e.g., by the PSD analyzer 313) to construct an atomic scale three-dimensional (3D) compositional profile 400 of the tip 391 of the sample 390 (see process step 516 and FIG. 4F). This 3D compositional profile 400 can indicate one or more different material layers (e.g., see layers 401-405 of metal(s), semiconductor(s) and/or insulator(s)) and the locations and shapes of those layer(s) within the sample.

It should be understood that the 3D compositional profile 400 shown in FIG. 4F is for illustration purposes and is not intended to be limiting. The number of layers and/or different types of materials will vary from sample to sample. However, since the disclosed APT method is designed to avoid or minimize cracks in the sides of the sample even when any of the materials within the sample start off with a relatively high critical energy level (Q) required for evaporation of atoms (e.g., even when the materials within the sample include semiconductor(s) and/or insulator(s)), the accuracy of the 3D compositional profile is improved as compared to prior art APT systems. Specifically, by using the disclosed APT method, the material layers that are present in the sample will be accurately identified and shown in the 3D compositional profile with the appropriate shape, thickness, etc.

Also disclosed herein are embodiments of a computer program product. This computer program product can be computer readable storage medium that has program instructions embodied therewith (e.g., stored thereon). The program instructions can be executable by the controller (e.g., a computer or processor) of the above-described atom probe tomography (APT) system 300 shown in FIG. 3 to cause the APT system 300 and, particularly, the components thereof to perform a method and, particularly, the above-described APT method shown in the flow diagram of FIG. 5.

More specifically, as mentioned above, the present invention may be implemented as a system or a method. Additionally, aspects of the invention (e.g., the controller, described above) may be implemented in the form a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may have copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
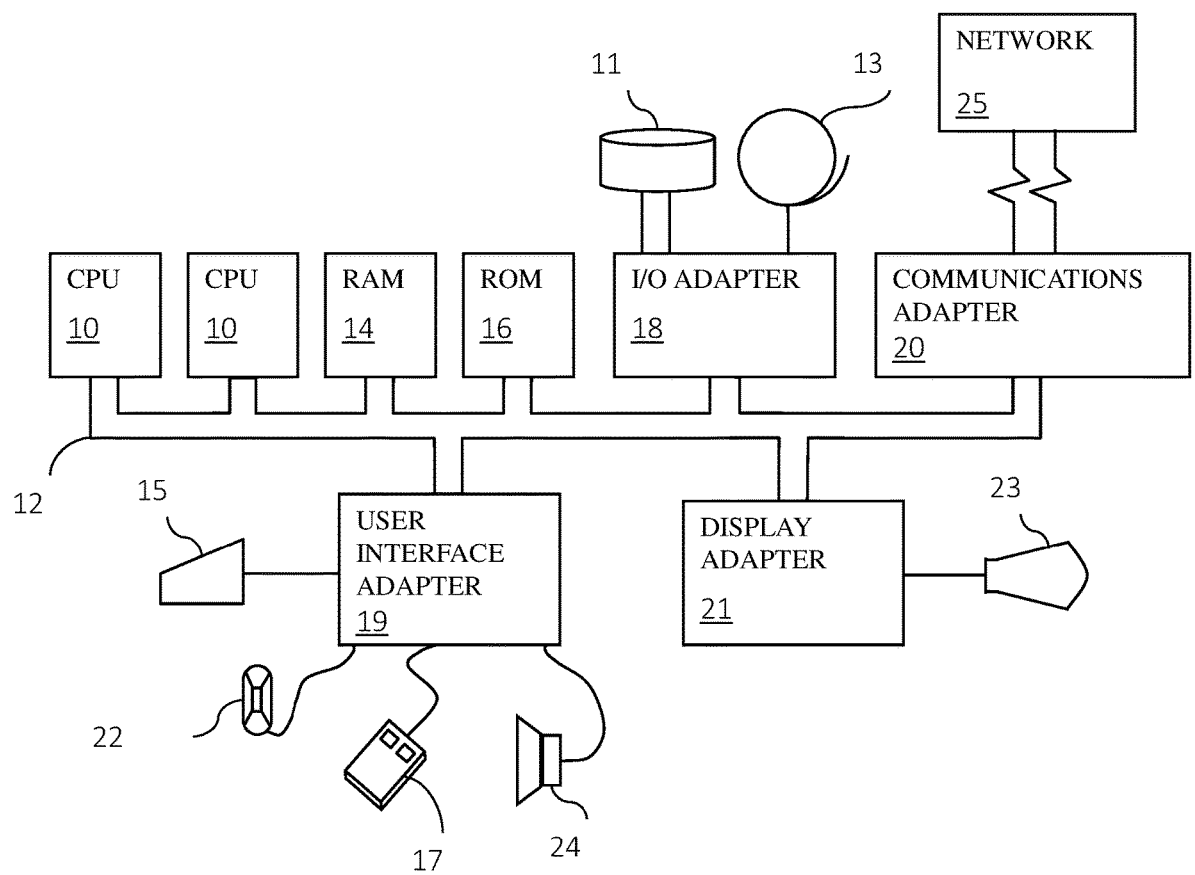
FIG. 6 is a representative hardware environment that can be employed for implementing aspects of the disclosed embodiments.

A representative hardware environment (i.e., a computer system) for implementing aspects of the invention (e.g., the controller 301 of the APT system 300) is depicted in FIG. 6. This schematic drawing illustrates a hardware configuration of an information handling/computer system in accordance with the embodiments herein. The computer system incorporates at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an atom probe tomography (APT) system and method. In the disclosed embodiments, a compositional analysis of the tip of a sample (e.g., of an integrated circuit (IC)) can be performed by concurrently applying different types of energy to the sample in order to cause field evaporation of atoms from the sample surface at the distal end of the tip and by capturing and analyzing the evaporated atoms. To ensure an accurate compositional analysis based on the evaporated atoms, the different types of energy can include: a relatively high D.C. voltage, which can be applied to the sample to lower the critical energy level (Q) for atom evaporation; first laser pulses, which can be applied to opposing first sides, respectively, of the tip near the distal end to further lower the critical energy level (Q) and which can also be asynchronous (e.g., 180°-phase-shifted) so that resulting standing wave patterns of heat distribution across the sample are cancelled out to avoid tip damage; and second laser pulse(s), which is/are lastly applied to second side(s) of the tip near the distal end to reach the critical energy level (Q), thereby causing field evaporation of atoms from the sample surface at the distal end of the tip. Advantages of the disclosed APT system and method embodiments include, but are not limited to, improved 3D compositional profile accuracy without damaging or losing the sample, improved suitability for use with samples containing a wide variety of materials with a wide variety of critical energy levels, and faster analysis times.

What is claimed is:

1. An atom probe tomography system comprising:
a voltage supply device electrically connectable to a sample having a tip with a distal end; and
multiple laser devices comprising: two first laser devices aimable toward opposing first sides of the tip; and at least one second laser device aimable toward at least one second side of the tip;
wherein the voltage supply device and the multiple laser devices are structured to concurrently apply different types of energy to the sample during performance of a compositional analysis of the tip by the atom probe tomography system,
wherein the voltage supply device is structured to apply a bias voltage to the sample,
wherein the first laser devices are structured to apply first laser pulses to the opposing first sides, respectively, of the tip adjacent to the distal end such that the first laser pulses are asynchronous,
wherein the at least one second laser device is structured to apply at least one second laser pulse to the at least one second side of the tip adjacent the distal end, and
wherein the different types of energy applied to the sample by the voltage supply device and the multiple laser devices cause evaporation of atoms from the distal end of the tip during the performance of the compositional analysis of the tip.

2. The atom probe tomography system of claim 1, further comprising:
a position-sensitive detection device positioned adjacent to the distal end of the tip,
wherein the position-sensitive detection device is structured to receive atoms evaporated from the distal end of the tip during the performance of the compositional analysis of the tip,
wherein the position-sensitive detection device is configured to determine chemical nature and original position information for received atoms, and
wherein the position-sensitive detection device is further configured to generate a three-dimensional compositional profile for the tip based on the chemical nature and original position information for the received atoms; and
a controller in communication with the voltage supply device, the multiple laser devices and the position-sensitive detection device, wherein the controller is configured to control the voltage supply device, the multiple laser devices and the position-sensitive detection device so as to cause the performance of the compositional analysis of the tip.

3. The atom probe tomography system of claim 2, further comprising a second voltage supply device electrically connectable to the sample and to a local electrode positioned between the distal end of the tip and the position-sensitive detection device, wherein the second voltage supply device is structured to apply a voltage pulse between the sample and the local electrode during the compositional analysis of the tip.

4. The atom probe tomography system of claim 1,
wherein application of the bias voltage and the first laser pulses reduces a critical energy level for surface evaporation of atoms from the distal end,
wherein, only with the bias voltage, the first laser pulses, and the at least one second laser pulses, is the critical energy level reached, and
wherein the first laser pulses are essentially identical and asynchronous such that standing wave patterns of heat distribution generated in the sample due to the first laser pulses are offset and have corresponding energy maxima that are less than a given threshold to avoid heat-related damage to side surfaces of the tip.

5. The atom probe tomography system of claim 1, wherein the first laser pulses are 180°-phase-shifted.

6. The atom probe tomography system of claim 1, wherein the multiple laser devices comprise two second lasers devices aimable toward opposing second sides of the tip, and
wherein the second laser devices are structured to apply second laser pulses to the opposing second sides, respectively, of the tip adjacent to the distal end during the compositional analysis of the tip such that vector directions of the first laser pulses are perpendicular to vector directions of the second laser pulses.

7. The atom probe tomography system of claim 6, wherein the second laser pulses have a same wavelength and a same amplitude.

8. The atom probe tomography system of claim 6, wherein the second laser pulses have any of different wavelengths and different amplitudes.

9. The atom probe tomography system of claim 6, wherein the second laser pulses are asynchronous.

10. A method comprising:
providing an atom probe tomography system comprising: a voltage supply device electrically connectable to a sample having a tip with a distal end; a position-sensitive detection device positioned adjacent to the distal end of the tip; and multiple laser devices comprising: two first laser devices aimable toward opposing first sides of the tip; and at least one second laser device aimable toward at least one second side of the tip; and
performing a compositional analysis of the tip using the atom probe tomography system, wherein the performing of the compositional analysis of the tip comprises:
concurrently applying different types of energy to the sample to cause evaporation of atoms from the distal end of the tip, wherein the concurrently applying of the different types of energy to the sample comprises at least:
applying, by the voltage supply device, a bias voltage to the sample;
applying, by the first laser devices, first laser pulses to the opposing first sides, respectively, of the tip adjacent to the distal end such that the first laser pulses are asynchronous; and
applying, by the at least one second laser device, at least one second laser pulse to the at least one second side of the tip adjacent to the distal end; and
receiving, by the position-sensitive detection device, atoms evaporated from the distal end of the tip.

11. The method of claim 10,
wherein application of the bias voltage and the first laser pulses reduces a critical energy level for surface evaporation of atoms from the distal end,
wherein, only with the bias voltage, the first laser pulses, and the at least one second laser pulses, is the critical energy level reached, and
wherein the first laser pulses are essentially identical and asynchronous such that standing wave patterns of heat distribution generated in the sample due to the first laser pulses are offset and have corresponding energy maxima that are less than a given threshold to avoid heat-related damage to side surfaces of the tip.

12. The method of claim 10, wherein the first laser pulses are 180°-phase-shifted.

13. The method of claim 10,
wherein the multiple laser devices further comprise two second lasers devices aimable toward opposing second sides of the tip, and
wherein the concurrently applying of the different types of energy to the sample further comprises applying, by the second laser devices, two second laser pulses to the opposing second sides, respectively, of the tip adjacent to the distal end such that vector directions of the first laser pulses are perpendicular to vector directions of the second laser pulses.

14. The method of claim 13, wherein the second laser pulses are have a same wavelength and a same amplitude.

15. The method of claim 13, wherein the second laser pulses have any of different wavelengths and different amplitudes.

16. The method of claim 13, wherein the second laser pulses are asynchronous.

17. The method of claim 10, wherein the atom probe tomography system further comprises a second voltage supply device electrically connectable to the sample and to a local electrode positioned between the distal end of the tip and the position-sensitive detection device, and wherein the concurrently applying of the different types of energy to the sample further comprises applying, by the second voltage supply device, a voltage pulse between the sample and the local electrode.

18. The method of claim 10, wherein the performing of the compositional analysis of the tip further comprises determining, by the position-sensitive detection device, chemical nature and original position information for received atoms from the tip and generating, by the position-sensitive detection device based on the chemical nature and original position information for the received atoms, a three-dimensional compositional profile for the tip.

19. The method of claim 10, further comprising acquiring the sample to be analyzed such that the tip is sharp and essentially cone-shaped.

20. A computer program product comprising a computer readable storage medium having program instructions embodied therewith, the program instructions being executable by a controller of an atom probe tomography system to cause the atom probe tomography system to perform a method of analyzing a tip of a sample, the method comprising:
concurrently applying different types of energy to the sample to cause evaporation of atoms from a distal end of the tip, wherein the concurrently applying of the different types of energy to the sample comprises at least:
applying, by a voltage supply device of the atom probe tomography system, a bias voltage to the sample;
applying, by first laser devices of the atom probe tomography system, first laser pulses to opposing first sides of the tip adjacent to the distal end such that the first laser pulses are asynchronous; and
applying, by at least one second laser device of the atom probe tomography system, at least one second laser pulse to at least one second side of the tip adjacent to the distal end; and
receiving, by a position-sensitive detection device of the atom probe tomography system, atoms evaporated from the distal end of the tip;
determining, by the position-sensitive detection device, chemical nature and original position information for the received atoms; and
generating, by the position-sensitive detection device based on the chemical nature and original position information for the received atoms, a three-dimensional compositional profile for the tip.

\* \* \* \* \*